US007961480B2

(12) United States Patent
Besana et al.

(10) Patent No.: US 7,961,480 B2
(45) Date of Patent: Jun. 14, 2011

(54) DEVICE FOR HOUSING AND CONNECTION OF ACCESSORIES FOR SWITCHES

(75) Inventors: Stefano Besana, Terno d'Isola (IT); Antonello Antoniazzi, Milan (IT)

(73) Assignee: ABB S.p.A., Milan (IT)

( * ) Notice: Subject to any disclaimer, the term of this patent is extended or adjusted under 35 U.S.C. 154(b) by 115 days.

(21) Appl. No.: 11/913,851

(22) PCT Filed: May 3, 2006

(86) PCT No.: PCT/EP2006/062013
§ 371 (c)(1), (2), (4) Date: Nov. 8, 2007

(87) PCT Pub. No.: WO2006/120147
PCT Pub. Date: Nov. 16, 2006

(65) Prior Publication Data

US 2008/0180932 A1 Jul. 31, 2008

(30) Foreign Application Priority Data

May 13, 2005 (IT) .............................. BG2005A0027

(51) Int. Cl.
*H05K 7/00* (2006.01)

(52) U.S. Cl. ....... 361/837; 361/760; 439/76.2; 439/535; 335/132; 335/202; 335/174; 174/50; 174/58; 174/64; 200/400

(58) Field of Classification Search .................. 361/760; 439/76.2, 535; 335/132, 174; 174/50, 58, 174/64; 200/400; 248/906
See application file for complete search history.

(56) References Cited

U.S. PATENT DOCUMENTS

| | | | | |
|---|---|---|---|---|
| 4,884,164 | A * | 11/1989 | Dziura et al. | 361/97 |
| 5,162,766 | A | 11/1992 | Morris et al. | |
| 5,172,293 | A * | 12/1992 | Matsumoto et al. | 361/102 |
| 5,539,168 | A * | 7/1996 | Linzenich | 200/303 |
| 6,175,289 | B1 | 1/2001 | Bellotto | |
| 6,421,217 | B1 * | 7/2002 | Castonguay et al. | 361/115 |
| 2005/0151607 | A1 * | 7/2005 | Li et al. | 335/132 |

FOREIGN PATENT DOCUMENTS

| | | |
|---|---|---|
| CN | 1480967 A | 3/2004 |
| WO | 97/38431 | 10/1997 |

OTHER PUBLICATIONS

Patent Abstracts of Japan, vol. 14, No. 457 (E 0986) Oct. 2, 1990 for JP 02183831.
First Office Action issued in related Chinese Application No. 200680016446.7 on Dec. 18, 2009.

* cited by examiner

*Primary Examiner* — Jinhee J Lee
*Assistant Examiner* — Andargie M Aychillhum
(74) *Attorney, Agent, or Firm* — Connolly Bove Lodge & Hutz LLP

(57) ABSTRACT

The present invention relates to a device for housing and connection of accessories, particularly for low-voltage automatic switches, comprising an integrated wiring support. In particular, the housing and connection device (1) has a shaped structure (10) comprising an integrated wiring bus for electrical connection of the accessories. The shaped structure (10) moreover comprises one or more seats (20, 21, 22, 23, 24) for housing the accessories.

15 Claims, 8 Drawing Sheets

DEVICE FOR HOUSING AND CONNECTION OF ACCESSORIES FOR SWITCHES

CROSS-REFERENCE TO RELATED APPLICATION

This application is a National Stage entry under the PCT of International Application PCT/EP2006/062013 filed on May 3, 2006, which claims priority to BG2005A000027 filed on May 13, 2005. The entire contents of each application are incorporated herein by reference.

DESCRIPTION

The present invention relates to a device for housing and connection of accessories, in particular for low-voltage automatic switches and disconnectors, comprising an integrated wiring support.

As is known, low-voltage automatic switches and disconnectors (i.e., for applications with operating voltages of up to 1000 V) are devices conceived for safeguarding proper operation of specific parts of the electric wiring system in which they are inserted and of the corresponding loads. Automatic switches, for instance, ensure the rated current required for the different loads, enabling correct connection/disconnection of the loads to/from the circuit, as well as automatic isolation of the circuit protected. As is known, said automatic isolation occurs through galvanic separation or breaking of specially provided contacts to obtain total isolation of the load with respect to the electric-power source in the case of faulty operation of a specific branch of the wiring system. The devices that enable the automatic switch to recognize the states of faulty operation and intervene accordingly with opening of the circuit are normally referred to as protection units. These may be of a thermal, magnetic, magnetothermal or electronic type, or combinations thereof.

Automatic switches and disconnectors, in what follows referred to for reasons of brevity as "switches" can normally be provided with a wide range of additional accessories. Amongst these may be mentioned, for instance, auxiliary contacts for signalling the state (which may be open, closed or tripped), servo-assisted actuators for opening, closing and resetting (solenoid controls or motor-driven controls, devices for loading the springs), minimum voltage relays, maximum voltage relays, temperature sensors, and other similar devices, which as mentioned hereinafter, may also be included in the present invention.

According to the known art, the accessories are generally wired independently of each other by means of one or more buses designed for the various functions of supply, control, or transmission of the signals corresponding thereto.

The switches thus conceived are traversed in various ways by auxiliary cables of different types, which can, as the particular case may require, remain within the body of the automatic switch, or else terminate on the outside thereof to give rise to operative connections with other parts of the system, such as for example external displays, push-buttons and electronic control units, interlocking systems, dialogue units, or monitoring units.

Traditional technical solutions are proposed, for example, in the patent applications Nos. WO2004068669 and WO9532512.

WO9532512 proposes a common support for the protection relay and accessories, via the use of special connectors located on the base of said support, each of which is connected to cables for the supply and transmission of signals and/or commands. As is known, the presence of auxiliary cables is far from appreciated by installers, for example because it subjects the system to higher risks of error in the stage of wiring and maintenance. In addition, all the auxiliary conductors must be technically adequate from the electrical, mechanical, and thermal standpoints, as well as from the standpoint of electromagnetic compatibility. Furthermore, they must be readily identifiable, and this obviously leads to a high general complexity of the system, which is in turn inevitably associated to heavy burdens. Another drawback linked to the excessive presence of auxiliary cables consists in the need to guarantee for each of them an adequate protection from any undesirable mechanical or thermal action that might occur over time as a result of other components present within the automatic switch or the switchboard housing it. The very presence of cables in any case leads to the need to activate adequate maintenance cycles, the costs of which of course increase according to the complexity of the system.

WO2004068669 proposes the use of a single digital bus, common to a plurality of accessories, and an electronic interface unit capable of recognizing each of said accessories and getting it to work properly. As is known, in an electric wiring system, the presence of electronic interface units requires for its operation the presence of a supply even when the individual accessories required by the system are only of a passive type, such as for instance the auxiliary contacts. This aspect thus results in limits of applicability. If, for example, a cut in said auxiliary supply occurs, this results in a failure of each accessory, and hence all of the accessories, including those of a passive type, fail to operate.

It is evident from the above description that there exists in the state of the art the need to have technical solutions that will represent a valid alternative to known methods and devices for installation of accessories for automatic switches.

The primary task of the present invention is to provide a device for housing and connection of accessories, in particular for low-voltage automatic switches and disconnectors, which will enable the drawbacks referred to above to be overcome, thus simplifying installation of the various accessories.

In the framework of this task, one of the purposes of the present invention is to provide a device for the housing and connection of accessories, particularly for low-voltage switches, in which the problems of excessive wiring and connections typically present in switches of the known art are solved.

Yet a further purpose of the present invention is to provide a device for housing and connection of accessories, particularly for low-voltage switches, which, as compared to systems of a known type, will enable complete elimination, or at least significant reduction, of the possible risks linked to the possibility of wrong wiring.

Another purpose of the present invention is to provide a device for housing and connection of accessories, particularly for low-voltage switches, that will enable installation of accessories and devices within said switches to be facilitated.

Not the least important purpose of the present invention is to provide a device for housing and connection of accessories, particularly for low-voltage switches, which will present a high reliability, will be easy to manufacture, and will offer competitive costs.

The above task and the above purposes, as well as others that will emerge more clearly from what follows, are achieved by a device for housing and connection of accessories for low-voltage switches, according to the invention, which is characterized in that it comprises a shaped structure comprising an integrated wiring bus for electrical connection of said accessories, one or more housing seats for said accessories being provided on said shaped structure.

Thanks to its innovative structure, the housing and connection device according to the invention renders possible installation of the various accessories of the switch in a simplified way and without resorting to complicated wiring systems.

Further characteristics and advantages will emerge more clearly from the ensuing description of preferred but non-exclusive embodiments of a low-voltage switch according to the invention, illustrated by way of indicative and non-limiting example with the aid of the attached plate of drawings, in which.

Figure 1:
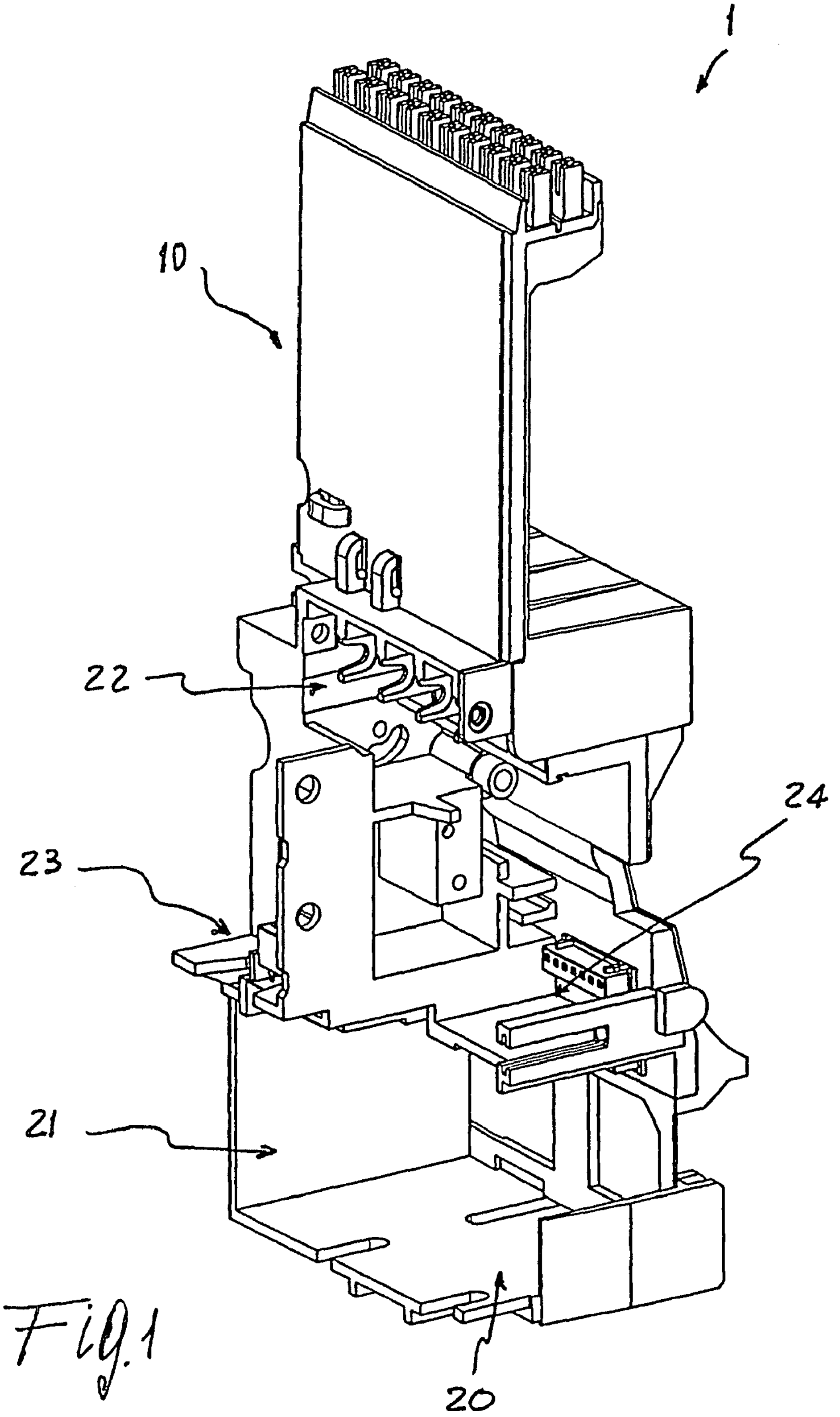
FIG. 1 is a perspective view of an embodiment of a housing and connection device according to the invention.

With reference to FIG. 1, the device 1 for housing and connection of accessories of low-voltage switches, according to the invention, comprises a shaped structure 10. Said shaped structure 10 in turn comprises an integrated wiring bus (not visible in FIG. 1) for electrical connection of said accessories, and one or more seats 20, 21, 22, 23, 24 for housing said accessories.

Figure 2:
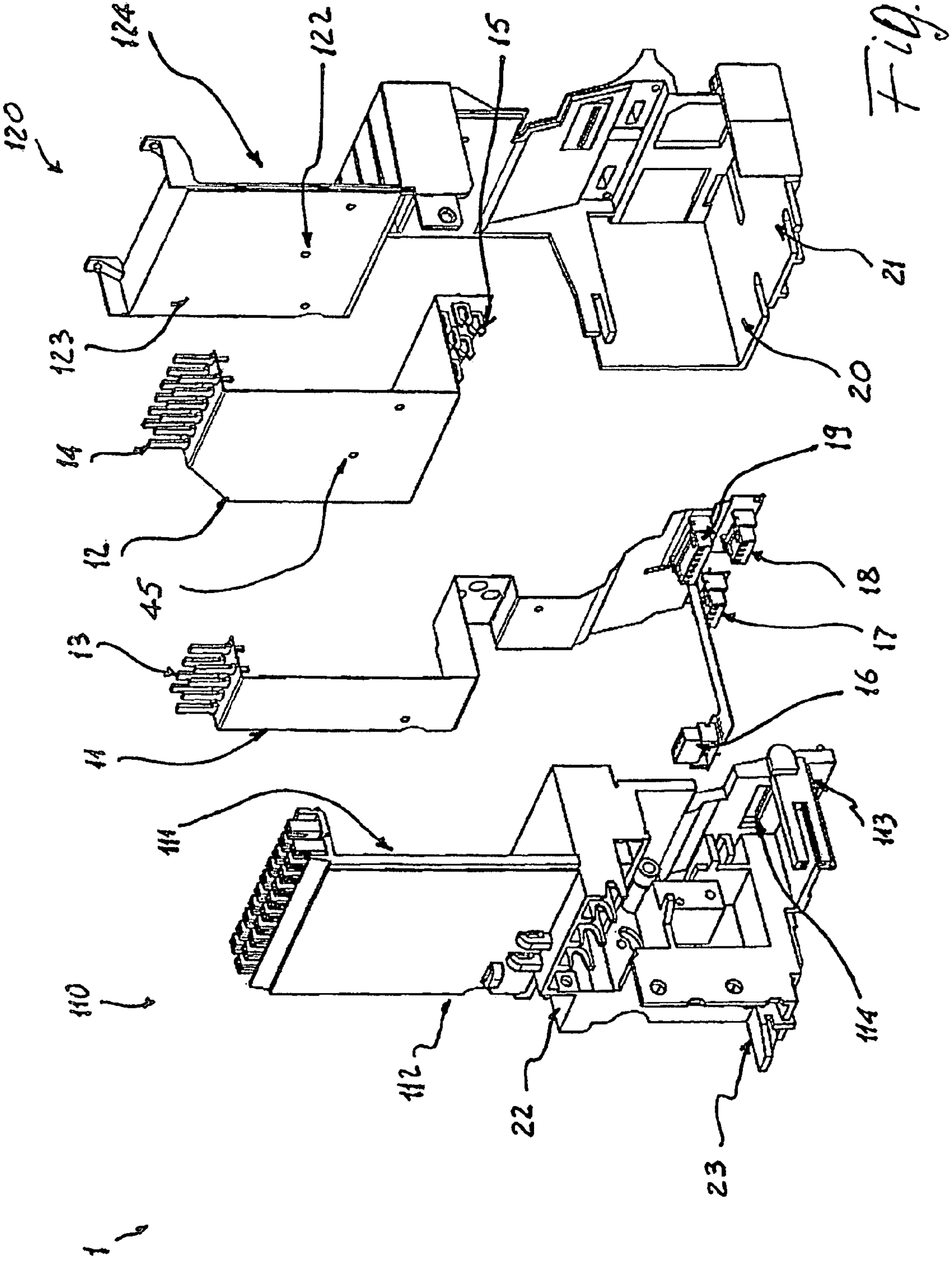
FIG. 2 is an exploded view of the housing and connection device illustrated in FIG. 1.

In particular, with reference to FIG. 2, said integrated wiring bus can conveniently comprise one or more printed connection paths 11, 12. On these paths, in a position corresponding to appropriate points thereof, are positioned one or more terminal boards or terminals 13, 14, 15, 16, 17, 18, 19 for connection to said accessories or to other devices. In the embodiment illustrated in FIG. 2, the terminal boards or terminals 15, 16, 17, 18 and 19 are designed for connection to accessories or devices which, once assembly is completed, will be housed inside the switch, whilst the terminals 13 and 14 are designed for connection to devices or accessories external to the switch.

Once again with reference to FIG. 2, according to a preferred embodiment of the housing and connection device 1 according to the invention, the shaped structure 10 comprises a first half-shell 110 and a second half-shell 120, which are coupled to one another through geometrically mated coupling surfaces 111, 123. By the term "geometrically mated" is meant that said surfaces have a geometry designed to favour mutual coupling of the corresponding half-shells.

In particular, the first half-shell 110 preferably has a first surface 111 for positioning of said integrated wiring bus, which in the embodiment illustrated, is represented by the paths 11 and 12, and a second surface 112 comprising one or more seats 22, 23, 24 for housing said accessories. The second half-shell 120 preferably has a third surface 123 for positioning the paths 11 and 12 and coupling to the first surface 111 of the first half-shell 110, and a fourth surface 124 for coupling to a low-voltage switch.

Hence, according to this embodiment of the housing and connection device 1 of the invention, once the first and second half-shells 110 and 120 are coupled to one another, the connection bus comes to be located between said half-shells, as illustrated in FIG. 1.

Preferably, in addition to the seats 22, 23 and 24 present on the surface 112 of the first half-shell 110, the housing and connection device 1 according to the invention can comprise one or more seats 20, 21 for housing said accessories, which are obtained by coupling between said first half-shell 110 and said second half-shell 120. As may be seen from the attached figures in fact, the appropriate conformation of the half-shells 110 and 120 enables for instance, once the coupling between the half-shells has been made, two further seats 20 and 21 to be obtained in the bottom part of the shaped body 10.

Furthermore, the first half-shell 110 can have, in a position corresponding to said seats, one or more housing seats 20, 21, 22, 23, 24 and one or more openings for the passage of the connection terminal boards or connection terminals 13, 14, 15, 16, 17, 18, 19. In particular, with reference to FIGS. 2, 3 and 5, it may be seen how the terminal board 18 comes out of the first half-shell 110, through the opening 113, in a position corresponding to the seat 20. In the same way, the terminal board 19 comes out of the first half-shell 110, through the opening 114, in a position corresponding to the seat 24.

The terminal boards and the terminals can be brought outside the half-shells also using other solutions. For example, the terminal board 16 is brought into a position corresponding to the seat 23 through an appropriate extension of the path 11 that develops outwards through the first half-shell 110.

According to a preferred embodiment of the housing and connection device 1 according to the invention, the first half-shell 110 and/or the second half-shell 120 have means for holding said integrated wiring bus in position. In particular, said means for holding the bus in position can be constituted by pins appropriately positioned on the first surface 111 of the first half-shell 110. Said pins, which are not illustrated in the figures, traverse appropriate holes 45 present in the paths 11 and 12 and engage in corresponding holes 122 on the third wall 123 of the second half-shell 120, contributing both to holding the paths 11 and 12 in position and to the mechanical coupling of the half-shells 110 and 120.

In addition, the housing and connection device 1 according to the invention, can comprise means 30 of mechanical interface with one or more kinematic means of a low-voltage switch. These means of mechanical interface, through coupling with an appropriate kinematic means of the switch can, for example, serve to transmit the state of the switch (for example open, closed, tripped) to one or more accessories housed in the device 1.

Figure 3:
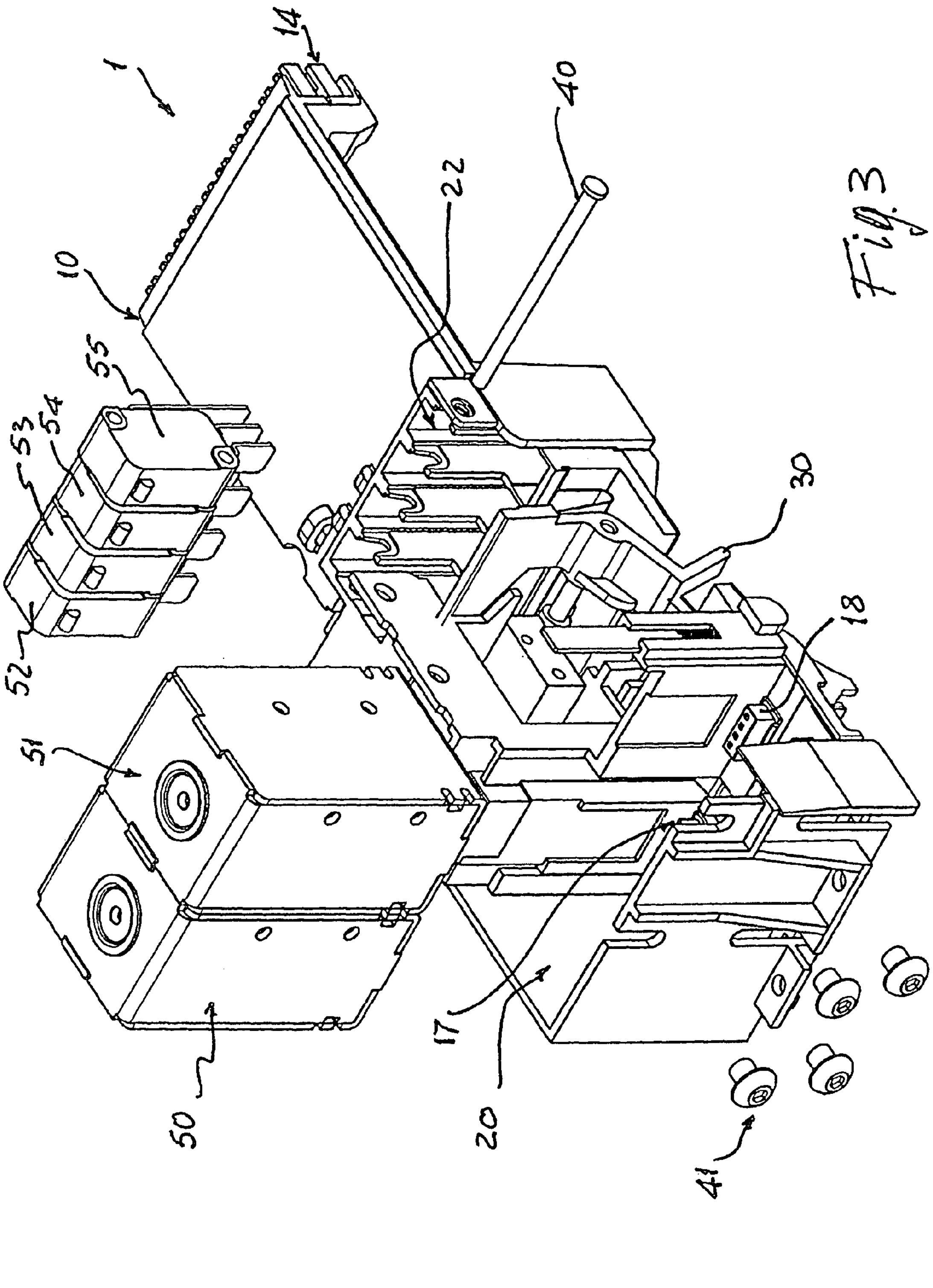
FIG. 3 is a perspective view that illustrates a first step of the procedure of insertion of accessories in the housing and connection device illustrated in FIG. 1.
Figure 4:
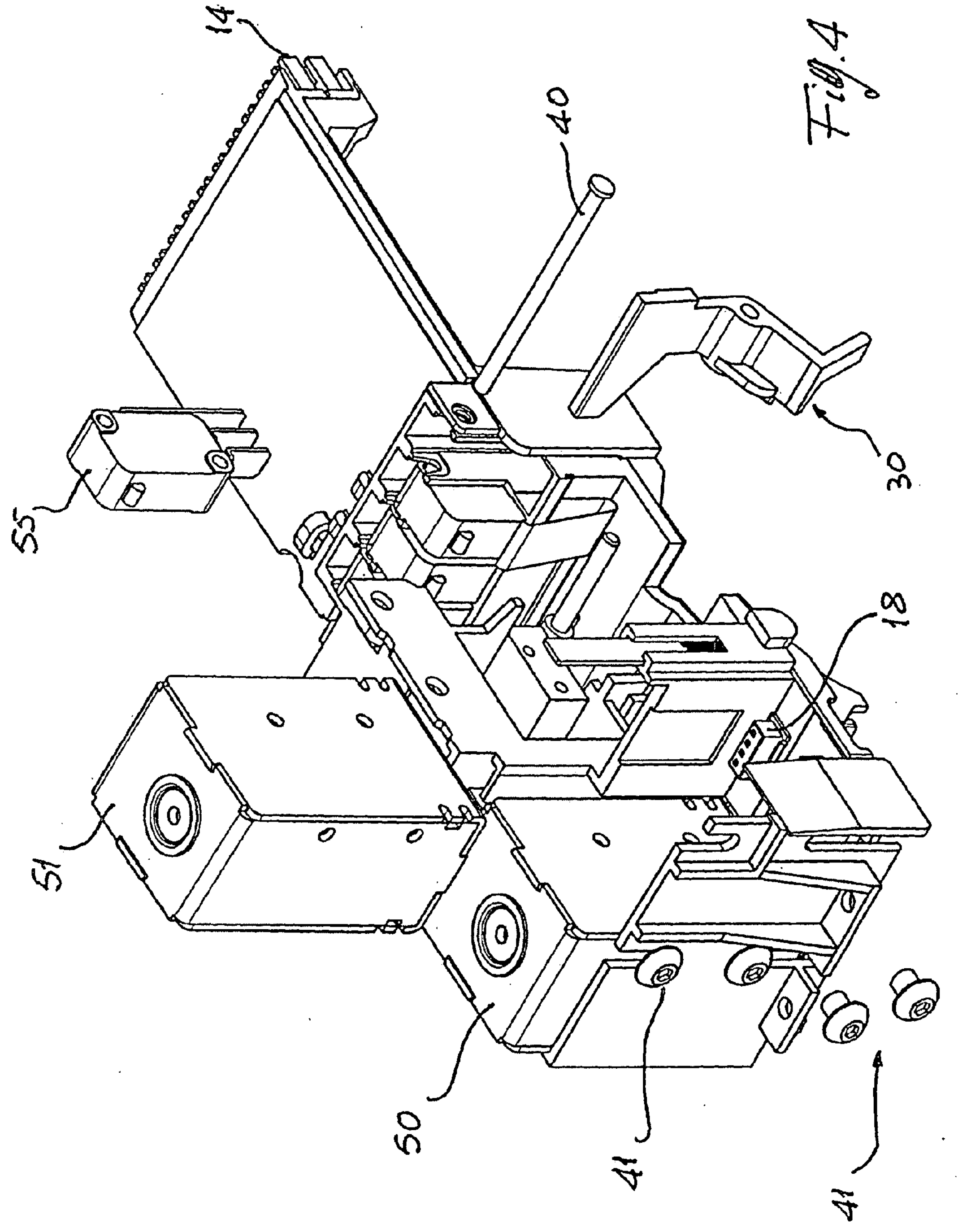
FIG. 4 is a perspective view that illustrates a second step of the procedure of insertion of accessories in the housing and connection device illustrated in FIG. 1.
Figure 5:
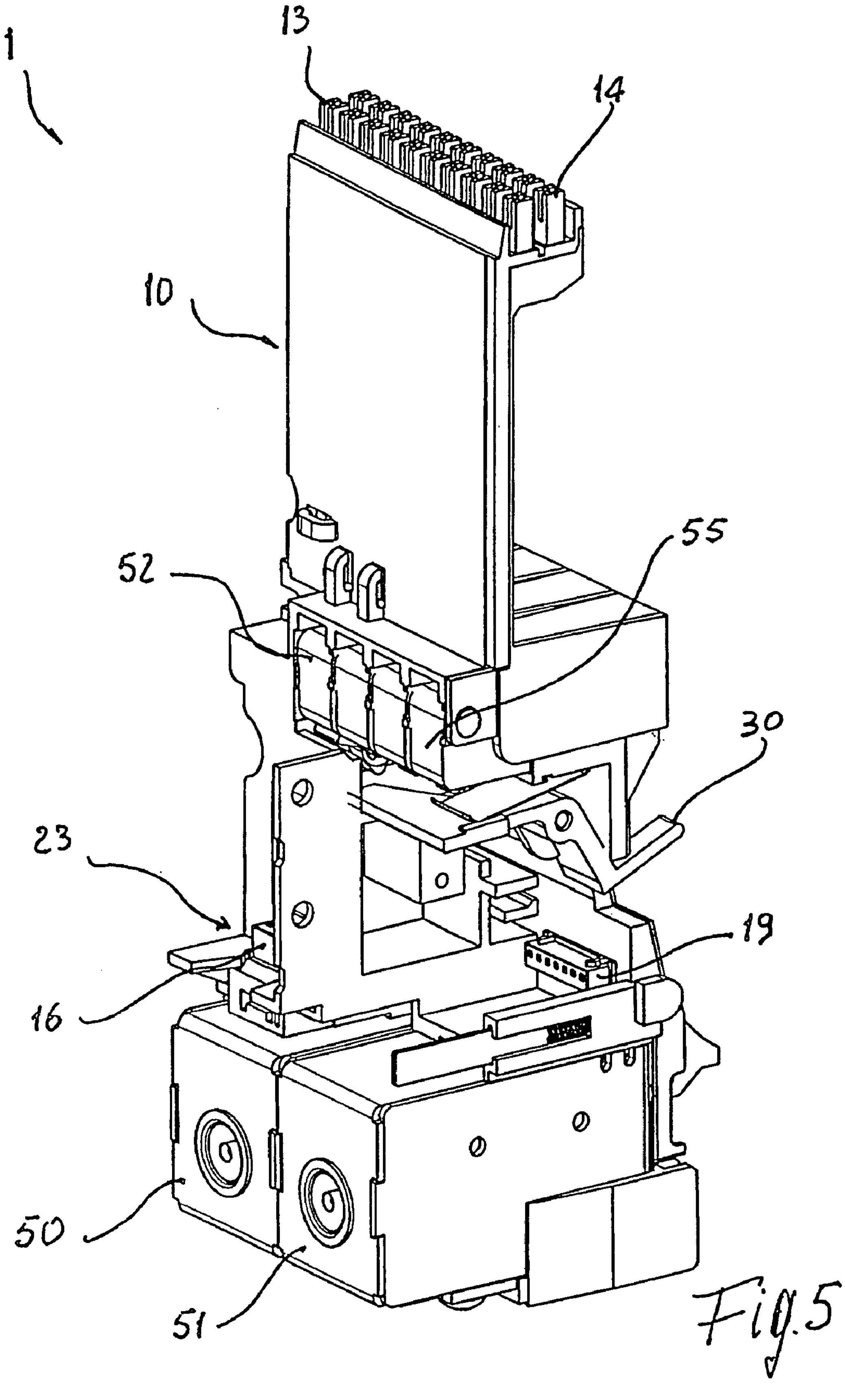
FIG. 5 is a perspective view illustrating an ensemble comprising some accessories inserted in the housing and connection device illustrated in FIG. 1.

With reference to FIGS. 3 to 5, the accessories—which by way of non-limiting example can, for instance, be auxiliary contacts for signalling the state, servo-assisted actuators for opening, closing and resetting, minimum voltage or maximum voltage relays, or temperature sensors—are normally provided with contact means designed to couple with the corresponding terminal boards or terminals present in the corresponding housing seats.

As may be seen from FIGS. 3 and 4, the accessory 50 is inserted, for instance, in the seat 20 and is coupled electrically to the wiring bus through the terminal board 17 (only partially visible in FIG. 3), present on the bottom of the seat 20. In the same way, the accessories 52, 53, 54 and 55 are inserted in the seats 22 and are electrically coupled to the terminals 15 (not visible in the above figures), whilst the accessory 51 is inserted in the seat 21, and is electrically coupled to the terminal board 18 present on the bottom of said seat 21.

Advantageously, the seats 20, 21, 22 and the corresponding accessories 50, 51, 52, 53, 54 and 55 have mated geometries, designed to favour their mutual coupling.

Preferably, the housing and connection device 1 according to the invention moreover comprises means for fixing said accessories. In the embodiment illustrated in FIGS. 3-5, said fixing means are, for example, constituted by screw means 41, which are used for holding the accessories 50 and 51 in position, and by a through rod 40, which is used for holding the accessories 52, 53, 54 and 55 in position.

With reference to FIG. 5, there is thus obtained, in an extremely simple way, an ensemble in which the accessories are connected to the respective terminals, said ensemble being ready to be inserted in an automatic switch.

The present invention, in a further aspect thereof, in fact relates also to a low-voltage switch (automatic or disconnector).

Figure 6:
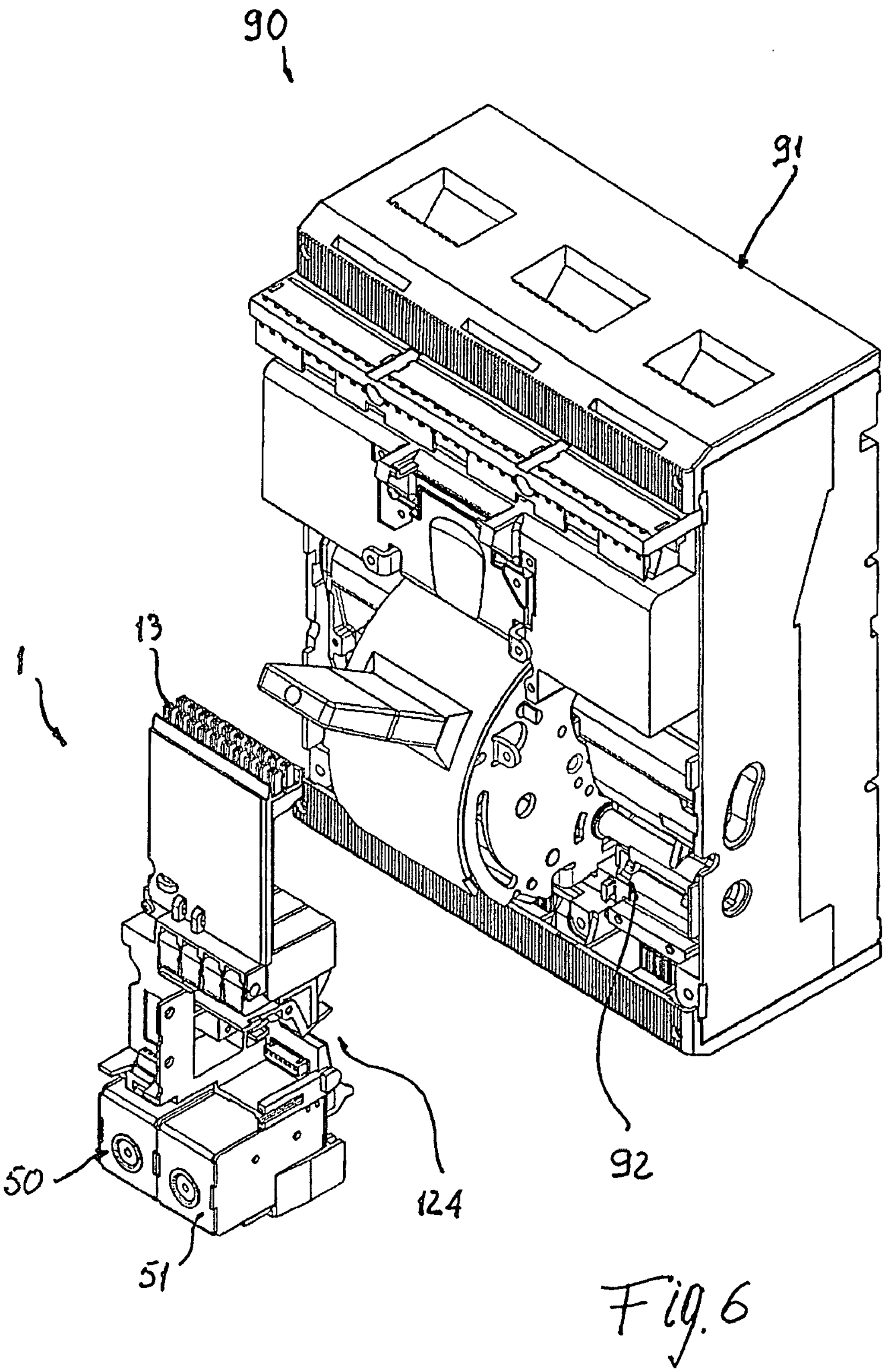
FIG. 6 is a perspective view that illustrates a first step of the procedure of insertion of the ensemble illustrated in FIG. 5 in a low-voltage automatic switch.

With reference to FIG. 6, the low-voltage switch 90 according to the invention comprises a body 91 containing one or more fixed contacts and corresponding mobile contacts, at least one control device, and one or more kinematic chains. The switch 90 according to the invention moreover comprises a seat 92 for housing the shaped structure 10 of a housing and connection device 1, as described previously.

Preferably, the seat 92 has a conformation geometrically mated with the fourth surface 124 of the second half-shell 120 of the housing and connection device 1, where the term "geometrically mated" is used to mean that said seat 92 and said surface 124 have a geometry designed to favour insertion and mutual coupling between the housing and connection device 1 and the switch 90. Said coupling can be favourably consolidated via the use, for instance, of fixing screws or other functionally equivalent means.

Furthermore, the coupling between the switch 90 and the device 1 can advantageously also comprise an operative connection between one or more of the kinematic chains of the switch and the means of mechanical interface 30 of the device 1.

Figure 7:
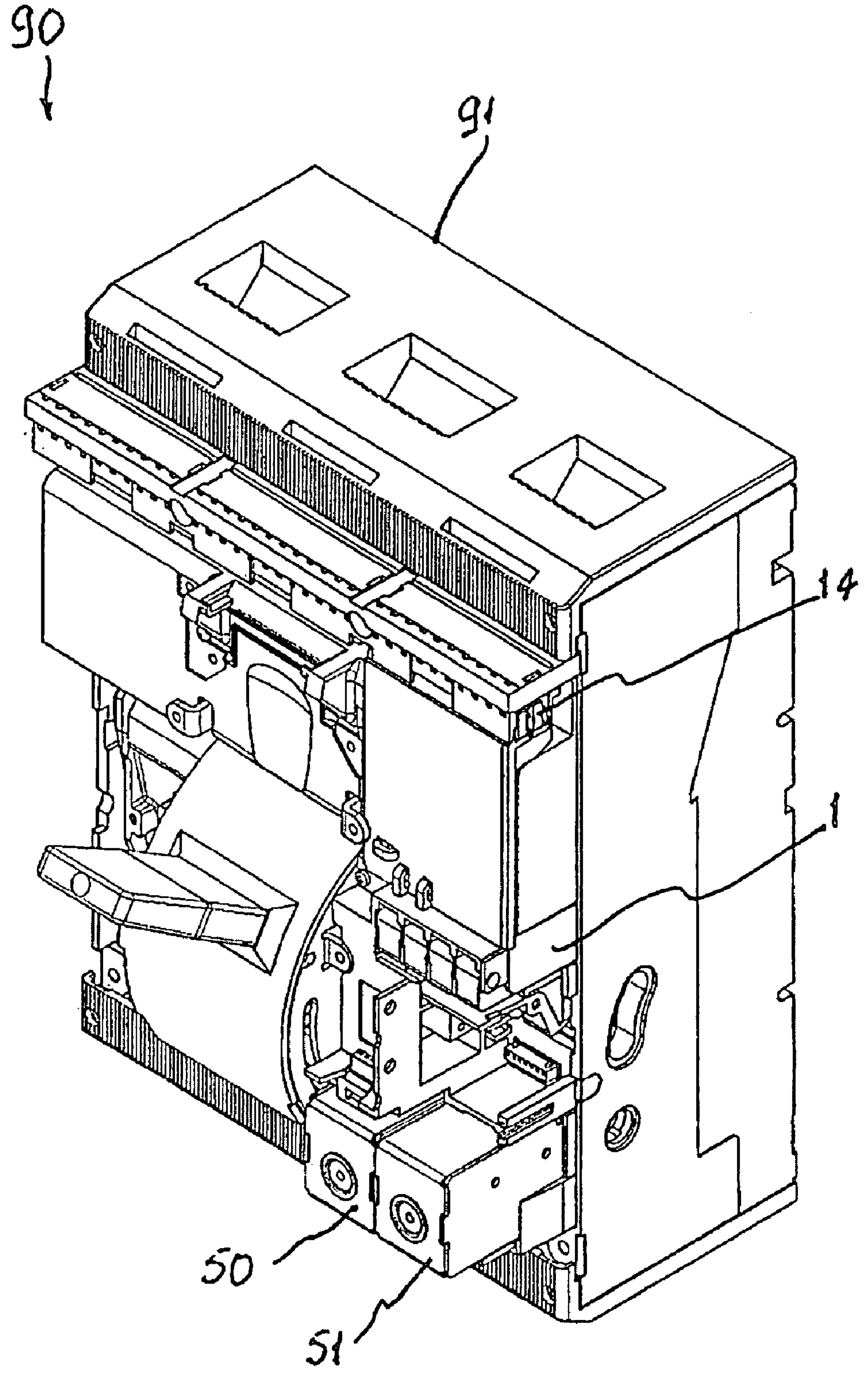
FIG. 7 is a perspective view that illustrates a low-voltage automatic switch with the ensemble illustrated in FIG. 5 inserted therein.
Figure 8:
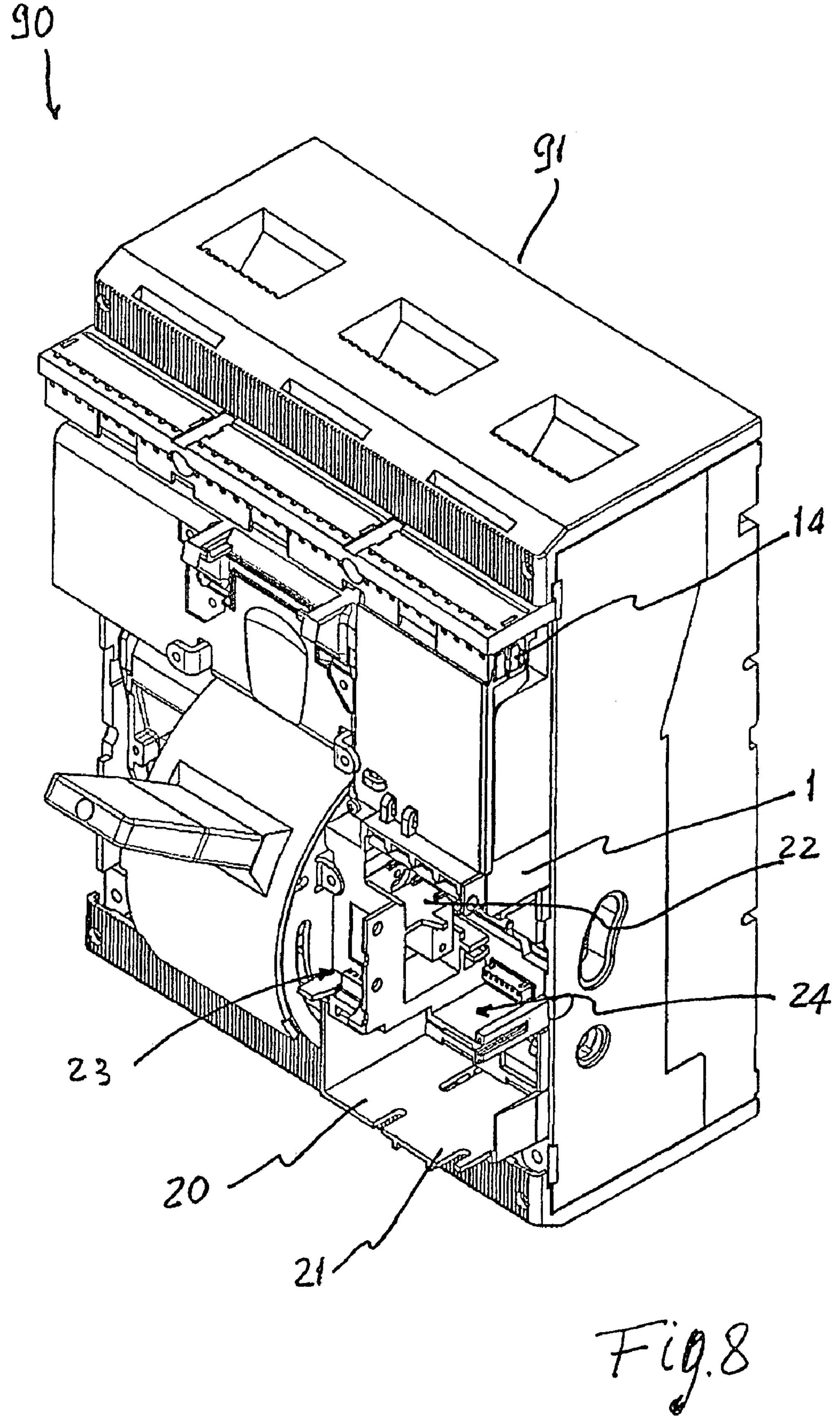
FIG. 8 is a perspective view that illustrates a low-voltage automatic switch with the housing and connection device illustrated in FIG. 1 inserted therein.

As may be seen from FIGS. 7 and 8, once the device 1 is inserted in the switch, one or more of the terminals of the wiring bus, for example the terminals 13 (not visible) and 14, can be inserted in a terminal board that enables connection of said wiring bus, and consequently of the accessories, with further devices external to the switch.

The assembly of a low-voltage automatic switch with one or more accessories can thus be performed in a very simple way. As illustrated in FIGS. 6 and 7, it is in fact sufficient to provide an ensemble that comprises the housing and connection device 1 according to the invention, equipped with the appropriate accessories, and insert it into the seat 92 provided on the switch 90.

Alternatively, as illustrated in FIG. 8, it is possible to insert a housing and connection device 1 according to the invention, without accessory devices, in the seat 92 provided on the switch 90 and put off to a later date insertion of the accessories. This can be obtained in a very simple way in so far as, since the wiring and the connections are already appropriately prearranged on the housing and connection device 1, it is sufficient to insert the accessories in the seats 20, 21, 22, 23, 24 provided in order to obtain a switch equipped with the desired accessories.

From the foregoing description, it may be seen that the device for housing and connection of accessories according to the invention enables solution of the problems of excessive wiring and connections typically present in switches of the known art, in so far as said wiring and connections can be eliminated, or in any case reduced, via integration of a wiring bus in said device.

In addition, the fact that it is possible to provide the positioning of terminals and cable clamps in appropriate and predetermined positions, enables complete elimination, or at least significant reduction, of the possible risks linked to the possibility of wrong wiring. As has been seen, the installation of accessories and devices within switches proves enormously facilitated in so far as, since all the connections are provided, it is sufficient to insert said accessories and devices in the appropriate seat to provide an ensemble functioning according to the principle of "plug and play", i.e., one that does not require any interventions or operations of wiring-up of a particular type.

It has been seen how the housing and connection device according to the invention, as well as the low-voltage switches comprising said device, fully achieve the pre-set purpose and tasks. On the basis of the description provided, other characteristics, modifications or improvements are possible, which are readily evident to the average person skilled in the branch. Said characteristics, modifications and improvements are hence to be considered as forming part of the present invention.

In practice, the materials used, as well as the contingent dimensions and shapes, may be any whatsoever according to the requirements and the state of the art.

The invention claimed is:

1. A device for housing and connection of accessories of low-voltage switches, said device comprising:

a shaped structure comprising an integrated wiring bus for electrical connection of said accessories; and one or more seats for housing said accessories being provided on said shaped structure, wherein said shaped structure comprises a first half-shell and a second half-shell, said first half-shell having a first surface and a second surface comprising one or more seats for housing said accessories, said second half-shell having a third surface for coupling to the first surface of said first half-shell, and a fourth surface for coupling with a low-voltage automatic switch, wherein said first and third surfaces when coupled keep in position printed connection paths of said wiring bus, said printed connection paths extending between said first and second half-shells, along said first and third surfaces when coupled, and said first and second half-shells being coupled together through geometrically mated coupling surfaces, wherein said wiring bus is set between said first and second half-shell, and said wiring bus is positioned along said geometrically mated coupling surfaces.

2. The housing and connection device according to claim 1, wherein said integrated wiring bus comprises one or more connection paths and one or more terminal boards or terminals for connection to said accessories or to other devices.

3. The housing and connection device according to claim 1, wherein one or more seats for housing said accessories are obtained by coupling between said first and second half-shells.

4. The housing and connection device according to claim 1, wherein said first half-shell has, in a position corresponding to said one or more housing seats, one or more holes for the passage of said one or more connection terminal boards or terminals.

5. The housing and connection device according to claim 1, wherein at least one of said first half-shell or said second half-shell have means for holding said integrated wiring bus in position.

6. The housing and connection device according to claim 1, further comprising means for mechanical interface with one or more kinematic means of a low-voltage switch.

7. The housing and connection device according to claim 1, further comprising means for fixing said accessories.

8. A low-voltage switch, comprising:

a housing and connection device for housing and connection of accessories of low-voltage switches, said device including a shaped structure including an integrated wiring bus for electrical connection of said accessories; and one or more seats for housing said accessories being provided on said shaped structure, wherein said shaped structure comprises a first half-shell and a second half-shell, said first half-shell having a first surface and a second surface comprising one or more seats for housing said accessories, said second half-shell having a third surface for coupling to the first surface of said first half-shell, and a fourth surface for coupling with a low-voltage automatic switch, wherein said first and third surfaces when coupled keep in position printed connection paths of said wiring bus, said printed connection paths extending between said first and second half-shells, along said first and third surfaces when coupled, and said first and second half-shells being coupled together through geometrically mated coupling surfaces, wherein said wiring bus is set between said first and second half-shell, and said wiring bus is positioned along said geometrically mated coupling surfaces.

9. The low-voltage switch according to claim 8, wherein one or more accessory devices are chosen from among auxiliary contacts for signaling the state, servo-assisted actuators for opening, closing and resetting, minimum voltage or maximum voltage relay, and temperature sensors.

10. A low-voltage switch, comprising a body including one or more fixed contacts and corresponding mobile contacts and one or more kinematic chains, the switch comprising:

a seat for housing a shaped structure of a housing and connection device, the device being for housing and connection of accessories of low-voltage switches, said device comprising a shaped structure comprising an integrated wiring bus for electrical connection of said accessories and one or more seats for housing said accessories being provided on said shaped structure, wherein said shaped structure comprises a first half-shell and a second half-shell, said first half-shell having a first surface and a second surface comprising one or more seats for housing said accessories, said second half-shell having a third surface for coupling to the first surface of said first half-shell, and a fourth surface for coupling with a low-voltage automatic switch, wherein said first and third surfaces when coupled keep in position printed connection paths of said wiring bus, said printed connection paths extending between said first and second half-shells, along said first and third surfaces when coupled, and said first and second half-shells being coupled together through geometrically mated coupling surfaces, wherein said wiring bus is set between said first and second half-shell, and said wiring bus is positioned along said geometrically mated coupling surfaces.

11. The low-voltage switch according to claim 10, wherein said first half-shell has a first surface for positioning said integrated wiring bus and a second surface comprising one or more seats for housing said accessories, said second half-shell having a third surface for coupling to the first surface of said first half-shell, and a fourth surface for coupling with a low-voltage automatic switch, and wherein said seat has a conformation geometrically mated with said fourth surface of said second half-shell of the housing and connection device.

12. The low-voltage switch according to claim 10, wherein said one or more kinematic chains are connected to means of mechanical interface of the housing and connection device.

13. A method for assembly of a low-voltage switch with one or more accessories, comprising:

providing a switch comprising a body including one or more fixed contacts and corresponding mobile contacts and one or more kinematic chains, wherein the switch includes a seat for housing a shaped structure;

providing a housing and connection device which comprises the shaped structure, the shaped structure comprising an integrated wiring bus for electrical connection of said accessories, one or more seats for housing said accessories being provided on said shaped structure;

inserting said housing and connection device into the seat of said switch; and inserting one or more accessories into corresponding seats of said housing and connection device, wherein said shaped structure comprises a first half-shell and a second half-shell, said first half-shell having a first surface and a second surface comprising one or more seats for housing said accessories, said second half-shell having a third surface for coupling to the first surface of said first half-shell, and a fourth surface for coupling with a low-voltage automatic switch, wherein said first and third surfaces when coupled keep in position printed connection paths of said wiring bus, said printed connection paths extending between said first and second half-shells, along said first and third surfaces when coupled, and said first and second half-shells being coupled together through geometrically mated coupling surfaces, wherein said wiring bus is set between said first and second half-shell, and said wiring bus is positioned along said geometrically mated coupling surfaces.

14. A low-voltage switch obtained by a procedure according to claim 13.

15. A method for the assembly of a low-voltage switch with one or more accessories, comprising:

providing a switch comprising a body including one or more fixed contacts and corresponding mobile contacts and one or more kinematic chains, wherein the switch includes a seat for housing a shaped structure;

providing a housing and connection device which includes the shaped structure, the shaped structure comprising an integrated wiring bus for electrical connection of said accessories, one or more seats for housing said accessories being provided on said shaped structure;

inserting one or more accessories into corresponding seats of said housing and connection device; and inserting the ensemble thus obtained into the seat of said switch, wherein said shaped structure comprises a first half-shell and a second half-shell, said first half-shell having a first surface and a second surface comprising one or more seats for housing said accessories, said second half-shell having a third surface for coupling to the first surface of said first half-shell, and a fourth surface for coupling with a low-voltage automatic switch, wherein said first and third surfaces when coupled keep in position printed connection paths of said wiring bus, said printed connection paths extending between said first and second half-shells, along said first and third surfaces when coupled, and said first and second half-shells being coupled together through geometrically mated coupling surfaces, wherein said wiring bus is set between said first and second half-shell, and said wiring bus is positioned along said geometrically mated coupling surfaces.

* * * * *